(12) United States Patent  
Liu et al.

(10) Patent No.: US 12,382,624 B2
(45) Date of Patent: Aug. 5, 2025

(54) 2T0C SEMICONDUCTOR STRUCTURE

(71) Applicant: CHANGXIN MEMORY TECHNOLOGIES, INC., Hefei (CN)

(72) Inventors: Youming Liu, Hefei (CN); Deyuan Xiao, Hefei (CN); Xingsong Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 532 days.

(21) Appl. No.: 17/887,526

(22) Filed: Aug. 15, 2022

(65) Prior Publication Data

US 2022/0392901 A1 Dec. 8, 2022

(51) Int. Cl.
*H10B 12/00* (2023.01)
*H10B 12/10* (2023.01)
*H10B 99/00* (2023.01)

(52) U.S. Cl.
CPC ............ *H10B 12/30* (2023.02); *H10B 12/10* (2023.02); *H10B 12/20* (2023.02); *H10B 99/10* (2023.02); *H10B 99/22* (2023.02)

(58) Field of Classification Search
CPC ........ H10B 12/00; H10B 12/10; H10B 12/20; H10B 12/30; H10B 99/10; H10B 99/22
See application file for complete search history.

(56) References Cited

U.S. PATENT DOCUMENTS

| | | | |
|---|---|---|---|
| 5,386,132 A | 1/1995 | Wong | |
| 6,133,141 A | 10/2000 | Kim | |
| 6,459,112 B1 | 10/2002 | Tsuboi et al. | |
| 11,201,213 B2 | 12/2021 | Chen | |
| 11,839,085 B2 | 12/2023 | Yin et al. | |
| 2003/0002359 A1 | 1/2003 | Kieslich | |

(Continued)

FOREIGN PATENT DOCUMENTS

| | | | |
|---|---|---|---|
| CN | 1458683 A | 11/2003 | |
| CN | 1499639 A | 5/2004 | |

(Continued)

OTHER PUBLICATIONS

European Patent Office, Extended European Search Report Issued in Application No. 22924558.4, Sep. 10, 2024, Germany, 8 pages.

(Continued)

*Primary Examiner* — Matthew E Warren
(74) *Attorney, Agent, or Firm* — Kilpatrick Townsend & Stockton LLP

(57) ABSTRACT

Embodiments provide a semiconductor structure. The semiconductor structure includes a substrate, a dielectric layer arranged on the substrate, and a plurality of memory cell layers. The plurality of memory cell layers are spaced in the dielectric layer along a first direction, and projections of any adjacent two of the plurality of memory cell layers on the substrate are overlapped. Each of the plurality of memory cell layers includes a plurality of memory cells spaced along a second direction. According to the embodiments, the plurality of memory cell layers are spaced in the dielectric layer along a direction perpendicular to the substrate, and each of the plurality of memory cell layers has a plurality of memory cells therein; and a source, a channel and a drain in each of the plurality of memory cells are arranged along a direction parallel to the substrate.

15 Claims, 11 Drawing Sheets

(56) References Cited

U.S. PATENT DOCUMENTS

| | | |
|---|---|---|
| 2003/0139011 A1 | 7/2003 | Cleeves et al. |
| 2005/0001253 A1 | 1/2005 | Sugimura |
| 2006/0240622 A1 | 10/2006 | Lee et al. |
| 2007/0228427 A1 | 10/2007 | Matsui et al. |
| 2012/0161229 A1 | 6/2012 | Kwon |
| 2012/0175607 A1 | 7/2012 | Shu et al. |
| 2013/0052803 A1 | 2/2013 | Roizin et al. |
| 2013/0264621 A1 | 10/2013 | Nishi et al. |
| 2013/0320433 A1 | 12/2013 | Cho et al. |
| 2015/0228623 A1 | 8/2015 | Oh et al. |
| 2019/0103407 A1 | 4/2019 | Kim et al. |
| 2019/0198675 A1 | 6/2019 | Sharma et al. |
| 2019/0252386 A1 | 8/2019 | Lee et al. |
| 2020/0043941 A1 | 2/2020 | Kim et al. |
| 2020/0083225 A1 | 3/2020 | Ma et al. |
| 2020/0227416 A1 | 7/2020 | Lilak et al. |
| 2020/0251151 A1 | 8/2020 | Kang et al. |
| 2020/0266113 A1 | 8/2020 | Tsugawa |
| 2020/0381450 A1 | 12/2020 | Lue et al. |
| 2021/0020747 A1 | 1/2021 | Chen |
| 2021/0151437 A1 | 5/2021 | Tomishima |
| 2021/0159229 A1 | 5/2021 | Gomes et al. |
| 2021/0257366 A1* | 8/2021 | Lee ................... H10B 12/50 |
| 2021/0296320 A1 | 9/2021 | Sandhu |
| 2021/0375875 A1 | 12/2021 | Brewer et al. |
| 2021/0375926 A1 | 12/2021 | Mehandru et al. |
| 2022/0085023 A1 | 3/2022 | Shin et al. |
| 2022/0157819 A1 | 5/2022 | Jung et al. |
| 2023/0103593 A1 | 4/2023 | Sakuma et al. |
| 2023/0363143 A1 | 11/2023 | Lee et al. |
| 2023/0389261 A1* | 11/2023 | Liu ..................... H10B 12/00 |

FOREIGN PATENT DOCUMENTS

| | | | | |
|---|---|---|---|---|
| CN | 102034759 A | | 4/2011 | |
| CN | 102544016 A | | 7/2012 | |
| CN | 107623033 A | | 1/2018 | |
| CN | 108401468 A | | 8/2018 | |
| CN | 108428703 A | | 8/2018 | |
| CN | 110875315 A | | 3/2020 | |
| CN | 110890371 A | | 3/2020 | |
| CN | 112466881 A | | 3/2021 | |
| CN | 112838088 A | | 5/2021 | |
| CN | 113424319 A | | 9/2021 | |
| CN | 113889473 A | | 1/2022 | |
| CN | 113972213 A | | 1/2022 | |
| CN | 114334980 A | | 4/2022 | |
| CN | 114373760 A | * | 4/2022 | ............. H01L 28/86 |
| CN | 114429944 A | * | 5/2022 | ........... H01L 23/528 |
| CN | 114446963 A | | 5/2022 | |
| CN | 114497055 A | | 5/2022 | |
| EP | 3826058 A1 | | 5/2021 | |
| JP | 2005252283 A | | 9/2005 | |
| KR | 20090118299 A | | 11/2009 | |
| KR | 20190038223 A | | 4/2019 | |
| KR | 20220059424 A | | 5/2022 | |
| TW | 200418168 A | | 9/2004 | |
| TW | 201643994 A | | 12/2016 | |
| TW | 202118058 A | | 5/2021 | |
| TW | 202205539 A | | 2/2022 | |
| TW | 202218129 A | | 5/2022 | |
| WO | 2019204795 A1 | | 10/2019 | |

OTHER PUBLICATIONS

European Patent Office, Extended European Search Report Issued in Application No. 22924572.5, Jul. 23, 2024, Germany, 8 pages.
Taiwan Patent Office, Office Action Issued in Application No. 112120161, Feb. 16, 2024, 8 pages.
Taiwan Patent Office, Office Action Issued in Application No. 112119290, Apr. 9, 2024, 4 pages.
Korean Intellectual Property Office, Office Action Issued in Application No. 10-2023-7027118, Apr. 16, 2024, 13 pages.
ISA State Intellectual Property Office of the People's Republic of China, International Search Report Issued in Application No. PCT/CN2022/098249, Dec. 26, 2022, WIPO, 9 pages.
ISA State Intellectual Property Office of the People's Republic of China, International Search Report Issued in Application No. PCT/CN2022/098017, Dec. 19, 2022, WIPO, 9 pages.
ISA State Intellectual Property Office of the People's Republic of China, International Search Report Issued in Application No. PCT/CN2022/098247, Dec. 19, 2022, WIPO, 9 pages.
ISA State Intellectual Property Office of the People's Republic of China, International Search Report Issued in Application No. PCT/CN2022/097528, Dec. 16, 2022, WIPO, 8 pages.
ISA State Intellectual Property Office of the People's Republic of China, International Search Report Issued in Application No. PCT/CN2022/098018, Dec. 28, 2022, WIPO, 8 pages.
United States Patent and Trademark office, Non-Final Office action issued in related U.S. Appl. No. 17/816,435, filed Apr. 2, 2025.
United States Patent and Trademark office, Non-Final Office action issued in related U.S. Appl. No. 17/816,156, filed Apr. 9, 2025.
United States Patent and Trademark office, Non-Final Office action issued in related U.S. Appl. No. 17/816,130, filed May 14, 2025.
Non-final office action issued in US corresponding U.S. Appl. No. 17/813,409 mailed on Jun. 5, 2025, 11 pages.

* cited by examiner

2T0C SEMICONDUCTOR STRUCTURE

CROSS-REFERENCE TO RELATED APPLICATION

This application claims priority to Chinese Patent Application No. 202210610517.7, titled "SEMICONDUCTOR STRUCTURE" and filed to the State Patent Intellectual Property Office on May 31, 2022, the entire contents of which are incorporated herein by reference.

TECHNICAL FIELD

The present disclosure relates to the field of semiconductor technology, and more particularly, to a semiconductor structure.

BACKGROUND

As a semiconductor memory that randomly writes and reads data at a high speed, a dynamic random access memory (DRAM) and is widely used in data storage devices or apparatuses. The DRAM includes a plurality of repeated memory cells, each of which typically includes a capacitor configured to store data information and a transistor configured to control reading data information in a capacitor structure.

To increase an integration level of the memory cells and facilitate integrated development of the memory cells, the memory cells are improved in related technologies. For example, each of the memory cells includes a first transistor and a second transistor connected to each other, and one of the first transistor and the second transistor is used as a memory element. However, such structure cannot meet a requirement for large storage capacity of a semiconductor structure, and thus is limited in use.

SUMMARY

In view of the above problems, an embodiment of the present disclosure provides a semiconductor structure, which includes:

a substrate; a dielectric layer arranged on the substrate; and a plurality of memory cell layers, where the plurality of memory cell layers are spaced in the dielectric layer along a first direction, and projections of any two adjacent of the plurality of memory cell layers on the substrate are overlapped. Each of the plurality of memory cell layers includes a plurality of memory cells spaced along a second direction, and each of the plurality of memory cells includes a first transistor and a second transistor connected to the first transistor. A first source, a first channel and a first drain of the first transistor are arranged along a third direction, where the third direction and the substrate are parallel to each other, the first direction, the second direction and the third direction are perpendicular to one another, and the second direction and the third direction are positioned in a same horizontal plane.

In addition to the technical problems solved by the embodiments of the present disclosure described above, technical features constituting technical solutions and beneficial effects brought by the technical features of these technical solutions, other technical problems that can be solved by the semiconductor structure provided by the embodiments of the present disclosure, other technical features included in the technical solutions and beneficial effects brought by these technical features will be described in further detail in some embodiments.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

REFERENCE NUMERALS IN THE ATTACHED DRAWINGS

Figure 1:
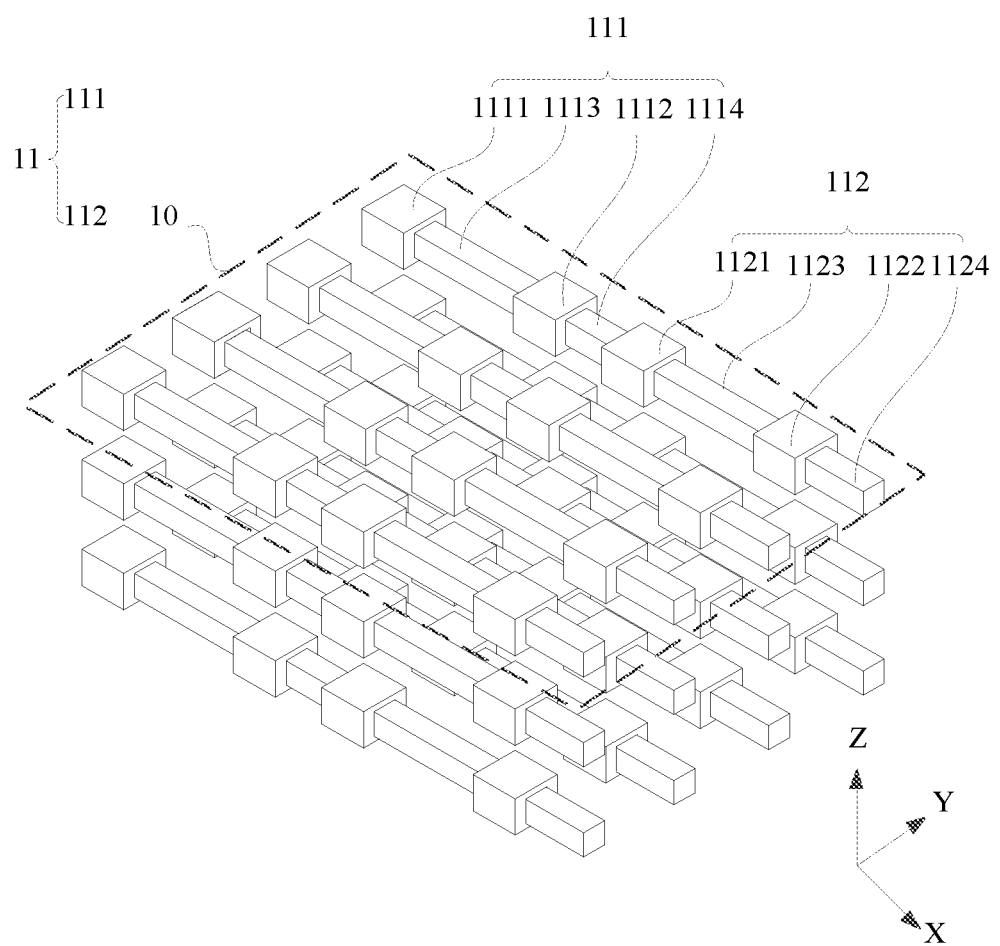
FIG. 1 is a schematic structural diagram of a memory cell layer provided by an embodiment of the present disclosure.
Figure 2:
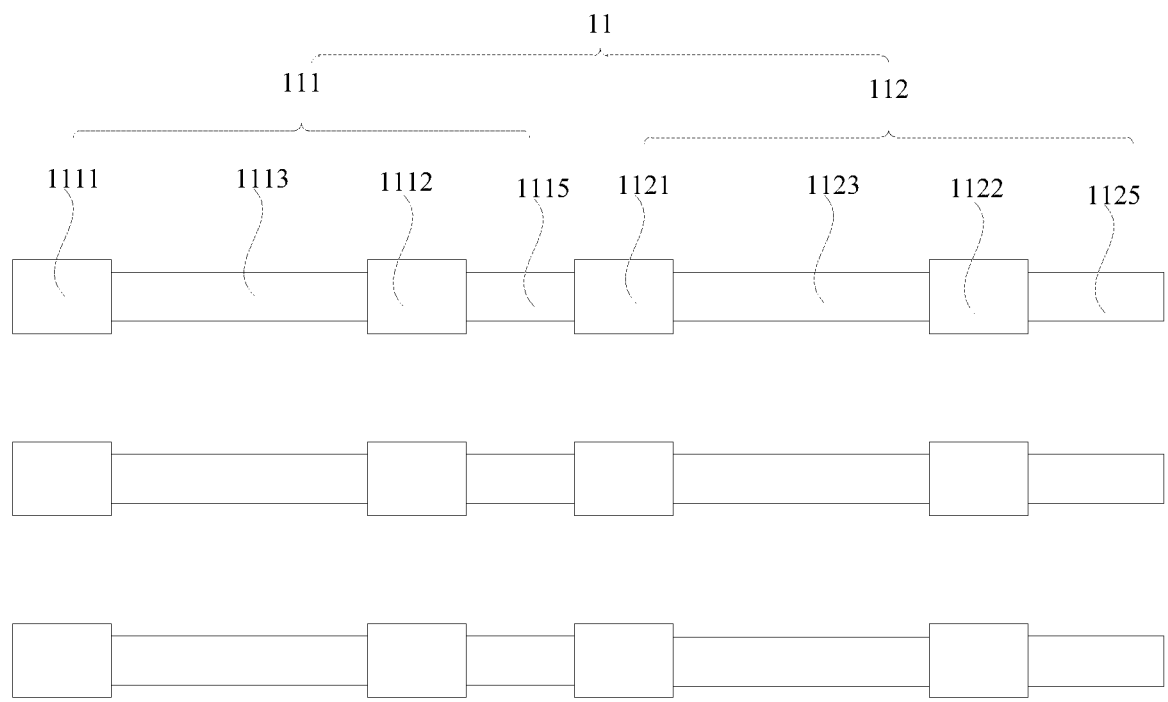
FIG. 2 is a principal view of FIG. 1.
Figure 3:
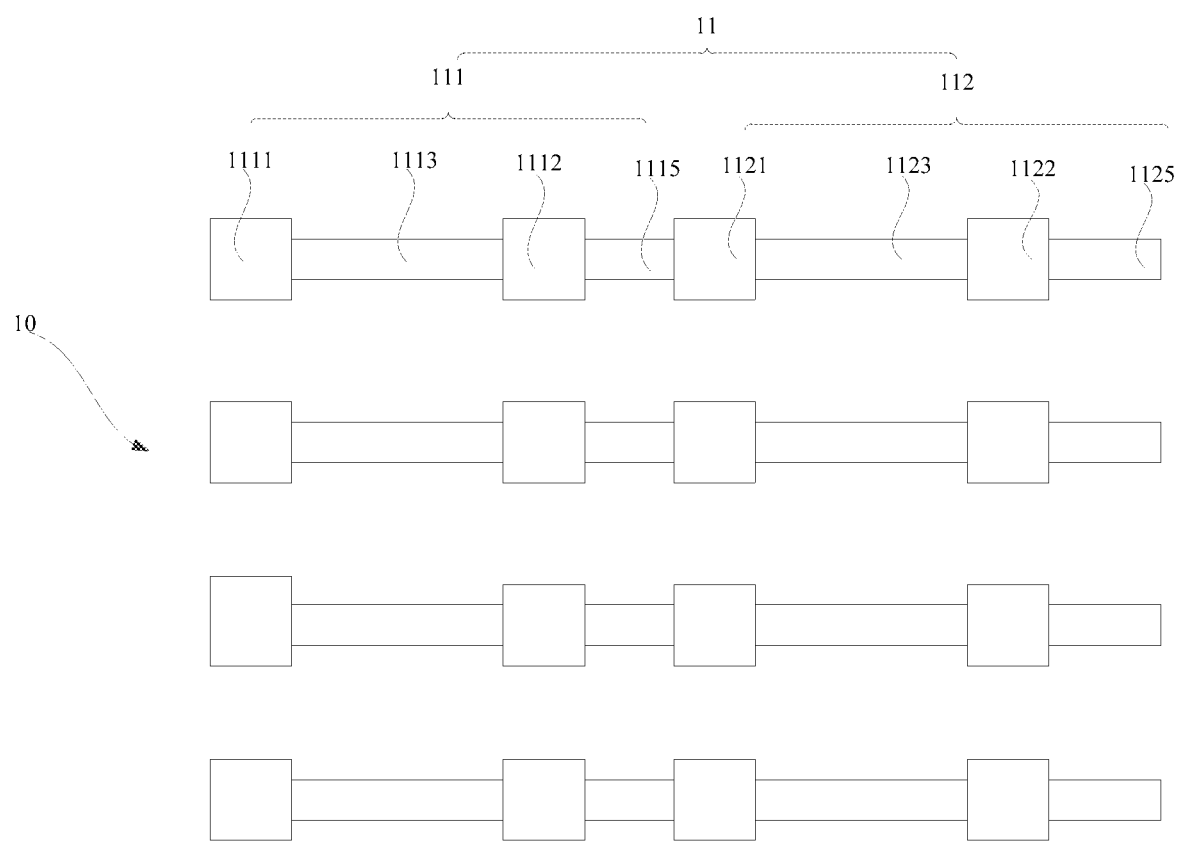
FIG. 3 is a vertical view of FIG. 1.

10: memory cell layer;
11: memory cell;
111: first transistor; 1111: first source; 1112: first drain; 1113: first channel; 1114: first gate oxide layer; 1115: first gate;
112: second transistor; 1121: second source; 1122: second drain; 1123: second channel; 1124: second gate oxide layer; 1125: second gate;
20: first data line; 21: fifth surface; 22: sixth surface; 23: seventh surface; 24: eighth surface;

30: second data line; 31: first surface; 32: second surface; 33: third surface; 34: fourth surface;
40: third data line;
50: fourth data line; and
60: insulating layer.

DETAILED DESCRIPTION

As described in the background art, to facilitate integrated development of a memory cell, the memory cell gradually develops from a 1T1C structure to a 2T0C structure in related technologies. That is, one of a first transistor and a second transistor is used as a memory element to reduce a volume occupied by the memory cell. However, the above memory cell generally extends along a direction perpendicular to a substrate, so it is difficult to fabricate more memory cells on the substrate, such that it is impossible to meet a requirement for large storage capacity of a semiconductor structure, and thus having a defect of limitation in use.

Based on the above-mentioned technical problems, an embodiment of the present disclosure provides a semiconductor structure. A plurality of memory cell layers are spaced in the dielectric layer along the direction perpendicular to the substrate, and each of the plurality of memory cell layers has a plurality of memory cells therein; and a source, a channel and a drain in each of the plurality of memory cells are arranged along a direction parallel to the substrate. In this way, each of the plurality of memory cells may be placed parallel to the substrate, thereby increasing number of the memory cell layers stacked up, and improving storage capacity of the semiconductor structure.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without creative efforts shall fall within the protection scope of the present disclosure.

An embodiment of the present disclosure provides a semiconductor structure. Referring to FIG. 1 to FIG. 4, the semiconductor structure includes a substrate (not shown in the figure), a dielectric layer (not shown in the figure) and memory cell layers 10. The substrate is configured to provide support, and may be made of a semiconductor material, which may be one or more of silicon, germanium, silicon germanium, silicon carbide, silicon on insulator or germanium on insulator.

The dielectric layer is arranged on the substrate, and is configured to provide support for the memory cell layers 10 to electrically insulate each of the memory cell layers 10, where the dielectric layer may include silicon oxide or silicon nitride.

A plurality of memory cell layers 10 are arranged in the dielectric layer. It should be noted that one of the plurality of memory cell layer 10 has a structure as shown in a dashed box in FIG. 1.

The plurality of memory cell layers 10 are spaced in the dielectric layer along a first direction, and projections of any adjacent two of the plurality of memory cell layers 10 on the substrate are overlapped. In this way, it may be ensured that the plurality of memory cell layers 10 are aligned in the first direction, thereby facilitating fabrication of the memory cell layers 10, and reducing difficulty of fabrication of the memory cell layers 10.

Each of the memory cell layers 10 includes a plurality of memory cells 11 spaced along a second direction. Each of the memory cells 11 includes a first transistor 111 and a second transistor 112 connected to the first transistor 111. One of the first transistor 111 and the second transistor 112 is used as a memory element to replace the capacitor in the related technologies, such that a volume occupied by the memory cell 11 may be reduced, and thus guarantee is provided for the integrated development of the memory cells 11.

A first source 1111, a first channel 1113 and a first drain 1112 of the first transistor 111 are arranged along a third direction, where the third direction and the substrate are parallel to each other. The first direction, the second direction and the third direction are perpendicular to each other, and the second direction and the third direction are positioned in a same horizontal plane, and the horizontal plane and a plane where the substrate is positioned are parallel to each other. In this way, each of the memory cells 11 may be placed parallel to the substrate, which may reduce a height of the memory cell 11 compared with the technical solutions in the related technologies where the memory cell 11 is placed perpendicular to the substrate. In this way, on the premise of the same height of the semiconductor structure, number of the memory cell layers 10 stacked may be increased, thereby increasing number of the memory cells 11 and improving the storage capacity of the semiconductor structure.

The first direction may be a direction perpendicular to the substrate, that is, a direction Z in FIG. 1. The second direction may be a direction Y in FIG. 1, and the third direction may be a direction X in FIG. 1.

It should be noted that the first transistor 111 and the second transistor 112 have the same structure. Therefore, an arrangement direction of a second source 1121, a second channel 1123 and a second drain 1122 of the second transistor 112 is also the third direction.

Figure 5:
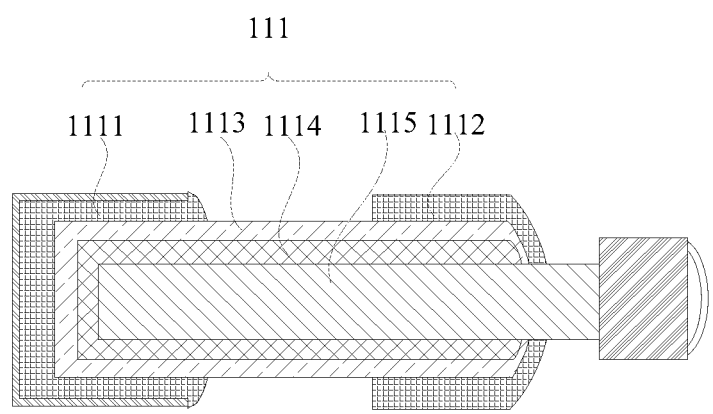
FIG. 5 is a schematic structural diagram of a first transistor provided by an embodiment of the present disclosure.

In some embodiments, as shown in FIG. 5, the first transistor 111 is a columnar transistor, and the first transistor 111 further includes a first gate 1115 and a first gate oxide layer 1114, where the first gate 1115 has a columnar structure, and an extension direction of the first gate 1115 is the third direction. The first gate oxide layer 1114 and the first channel 1113 sequentially surround a portion of the first gate 1115. That is, the first gate oxide layer 1114 and the first channel 1113 enclose to form a hollow columnar body, where the hollow columnar body has an opening in one end. One end of the first gate 1115 is inserted into a region enclosed by the first gate oxide layer 1114 and the first channel 1113 via the opening, and other end of the first gate 1115 is positioned outside the region enclosed by the first gate oxide layer 1114 and the first channel 1113. In this way, a portion of the first gate 1115 is exposed to facilitate connection between a subsequently formed data line and the first gate 1115, thereby controlling the first transistor 111 to be turned on or off.

The first source 1111 and the first drain 1112 are spaced on the first channel 1113, where the first source 1111 and the first drain 1112 respectively wrap two opposite ends of the first channel 1113, such that a contact area between the first source 1111 and the first channel 1113 and a contact area between the first drain 1112 and the first channel 1113 may be increased, thereby improving sensitivity of the first transistor 111, and improving performance of the semiconductor structure.

By taking an orientation as shown in FIG. 5 as an example, along the third direction, the first channel 1113 has a first end and a second end arranged oppositely, where the first end may be a left end of the first channel 1113, and the second end may be a right end of the first channel 1113.

In an example, the first source 1111 may wrap the first end, and the first drain 1112 may wrap the second end. In another example, the first source 1111 may wrap the second end, and the second drain 1122 may wrap the first end.

In this embodiment, a portion of the first gate 1115 is wrapped by the first channel 1113, such that a path of gate leakage may be reduced, and thus the performance of the semiconductor structure is improved.

Figure 4:
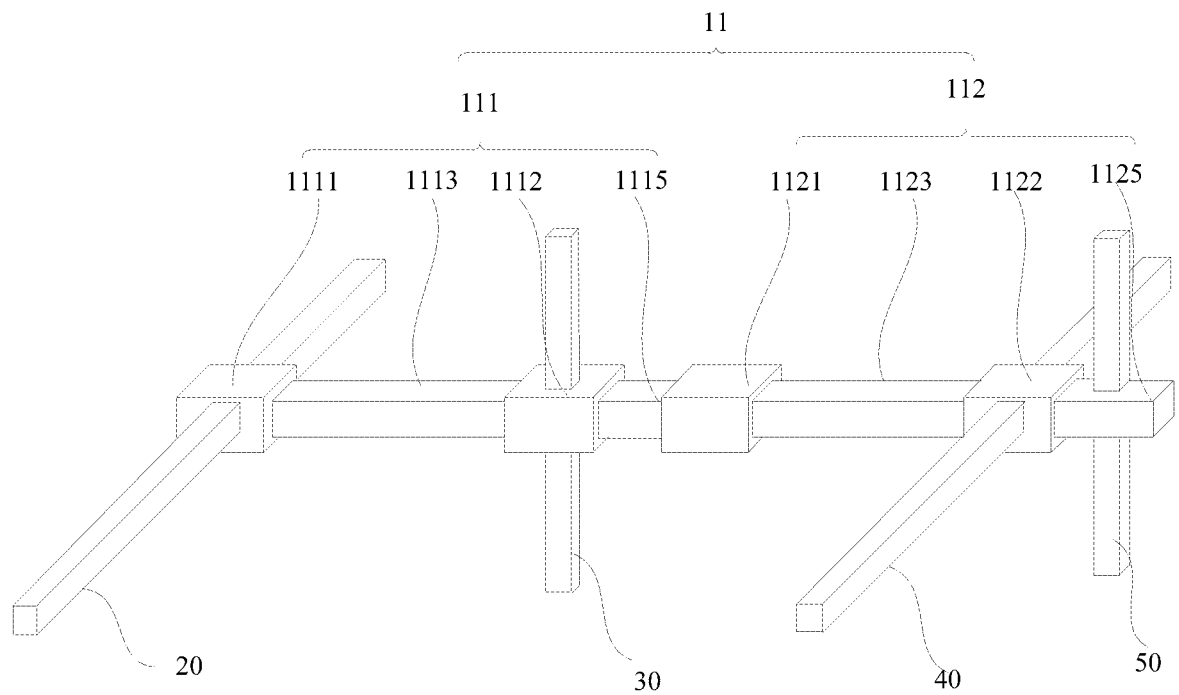
FIG. 4 is a schematic structural diagram of a memory cell and each data line provided by an embodiment of the present disclosure.

In some embodiments, with continued reference to FIG. 4, the second transistor 112 is a columnar transistor, and the second transistor 112 includes a second gate 1125, a second channel 1123, a second source 1121, and a second drain 1122. The second source 1121 is electrically connected to the exposed portion of the first gate 1115 to realize electrical connection between the first transistor 111 and the second transistor 112.

The second gate oxide layer 1124 and the second channel 1123 sequentially surround a portion of the second gate 1125, and the second source 1121 and the second drain 1122 are spaced on the second channel 1123, where the second source 1121 and the second drain 1122 respectively wrap around two opposite ends of the second channel 1123.

It should be noted that an arrangement manner of the second source 1121 and the second drain 1122 is similar to an arrangement manner of the first source 1111 and the first drain 1112, which is not repeated here in this embodiment.

In some embodiments, the first channel 1113 and the second channel 1123 are made of the same material, including any one of indium gallium zinc oxide, silicon, and silicon germanium.

When both the first channel 1113 and the second channel 1123 are made of the indium gallium zinc oxide, because the indium gallium zinc oxide has higher carrier mobility, sensitivity of the first transistor 111 and/or the second transistor 112 can be greatly improved, and power consumption of the memory cell 11 can be reduced.

The indium gallium zinc oxide also has better fluidity, and may grow on any desired interface, thus the difficulty of fabrication of the semiconductor structure may be lowered.

The indium gallium zinc oxide also has a higher off-state current, which may reduce a gate-induced drain leakage current of the semiconductor structure, and thus the performance of the semiconductor structure is improved.

The indium gallium zinc oxide is transparent, such that the first transistor 111 may be configured to fabricate a transparent semiconductor device. The indium gallium zinc oxide may be fabricated at a lower temperature, such that the first transistor 111 may be also configured to fabricate a flexible semiconductor device.

In some embodiments, as shown in FIGS. 6 to 17, the semiconductor structure further includes a first data line 20, a second data line 30, a third data line 40, and a fourth data line 50. These data lines are configured to control operation states of the first transistor 111 and the second transistor 112.

One of the first data line 20 and the second data line 30 is configured to connect the first sources 1111 or first drains 1112 of all of the first transistors 111 positioned in the same first direction, and other one of the first data line 20 and the second data line 30 is configured to connect the first drains 1112 or first sources 1111 of all of the first transistors 111 positioned on a same layer. In some embodiments, when the first data line 20 is connected to the first sources 1111 of all the first transistors 111 in the same first direction, that is, when the first data line 20 is connected to the first sources 1111 of all the first transistors 111 on the same column, correspondingly, the second data line 30 is connected to the first drains 1112 of all the first transistors 111 on the same layer. In some other embodiments, when the first data line 20 is connected to the first drains 1112 of all the first transistors 111 on the same column, correspondingly, the second data line 30 is connected to the first sources 1111 of all the first transistors 111 on the same layer.

When the first data line 20 is connected to the first sources 1111 of all the first transistors 111 positioned on the same layer, correspondingly, the second data line 30 is configured to connect the first drains 1112 of all the first transistors 111 positioned on the same column. When the first data line 20 is connected to the first drains 1112 of all the first transistors 111 positioned on the same layer, correspondingly, the second data line 30 is configured to connect the first sources 1111 of all the first transistors 111 positioned on the same column.

One of the third data line 40 and the fourth data line 50 is configured to connect the second drains 1122 or second gates 1125 of the second transistors 112 positioned in the same first direction, and other one of the third data line 40 and the fourth data line 50 is configured to connect the second gates 1125 or second drains 1122 of all of the second transistors 112 positioned on the same layer. It should be noted that an arrangement manner of the third data line 40 and the fourth data line 50 may be similar to an arrangement manner of the first data line 20 and the second data line 30, which is not repeated here in this embodiment.

In this embodiment, mode of connection between each data line and the memory cell 11 may be freely designed, such that fabrication of the memory cell 11 may be facilitated, and an application range of the semiconductor structure is extended.

In this embodiment, the plurality of data lines respectively connecting the transistors positioned on the same layer are arranged in an up-down staggered manner in the first direction. In an example, when the first data line is configured to connect the first transistors positioned on the same layer, a plurality of first data lines are arranged in an up-down staggered manner in the first direction. In another example, when the second data line is configured to connect the first transistors positioned on the same layer, a plurality of second data lines are arranged in an up-down staggered manner in the first direction, such that the data line connecting the transistors positioned on the same layer may be connected to other data lines, and thus the difficulty of fabrication of the semiconductor structure is lowered.

It should be noted that an arrangement manner of the third data line and the fourth data line is the same as an arrangement manner of the first data line and the second data line, which is not repeated here in this embodiment.

In some embodiments, there are a plurality of first data lines 20, a plurality of second data lines 30, a plurality of third data lines 40, and a plurality of fourth data lines 50.

As shown in FIG. 7 to FIG. 17, the plurality of first data lines 20 are spaced along the second direction, the plurality of first data lines 20 are spaced along the direction Y, each of the first data lines 20 extends along the first direction and connects all of the first sources 1111 positioned in the same first direction. Taking the orientation shown in FIG. 7 as an example, the first data line 20 extends along the direction perpendicular to the substrate and connects all the first sources 1111 positioned in the same column. In some embodiments, there are three first data lines 20, where in the second direction, a first one of the three first data lines 20 connects all the first sources 1111 on a first column, a second one of the three first data lines 20 connects all the first sources 1111 on a second column, and a third one of the three first data lines 20 connects all the first sources 1111 on a third column.

The plurality of second data lines 30 are spaced along the first direction, that is, the plurality of second data lines 30 are spaced along the direction perpendicular to the substrate, where each of the plurality of second data lines 30 extends along the second direction and connects all of the first drains 1112 on the same layer; and a projection of one of adjacent two second data lines 30 on the substrate is partially overlapped with a projection of other one of the adjacent two second data lines 30 on the substrate.

Figure 7:
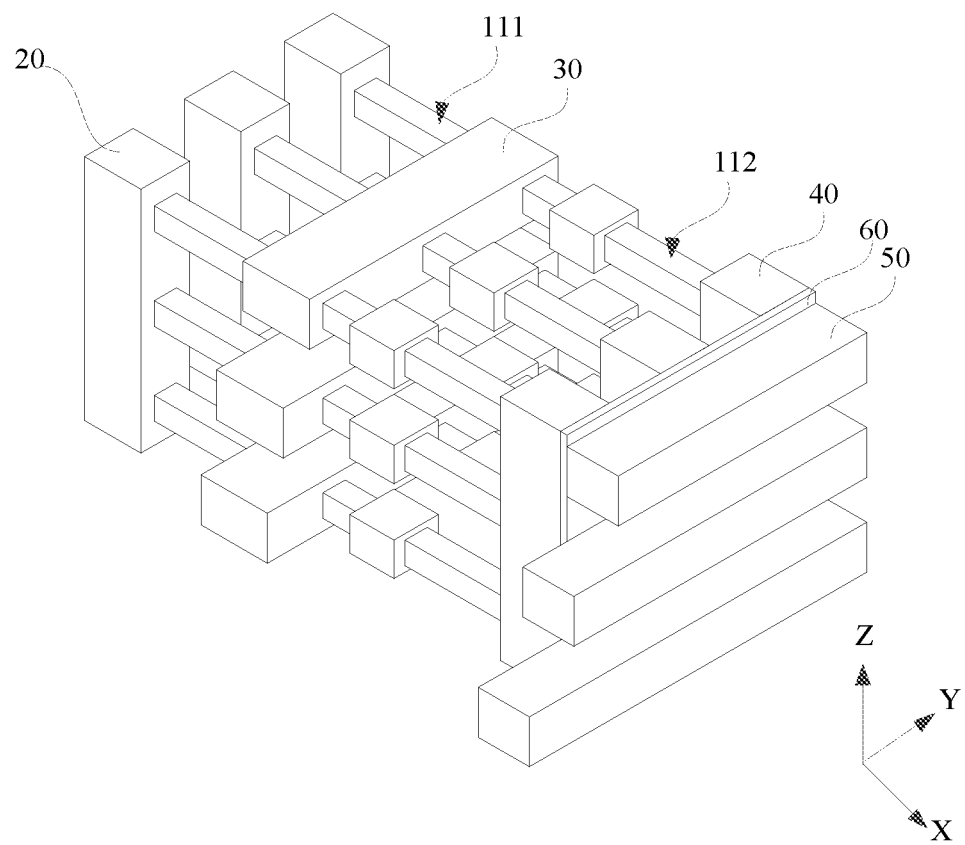
FIG. 7 is a schematic diagram I of a semiconductor structure provided by an embodiment of the present disclosure.
Figure 8:
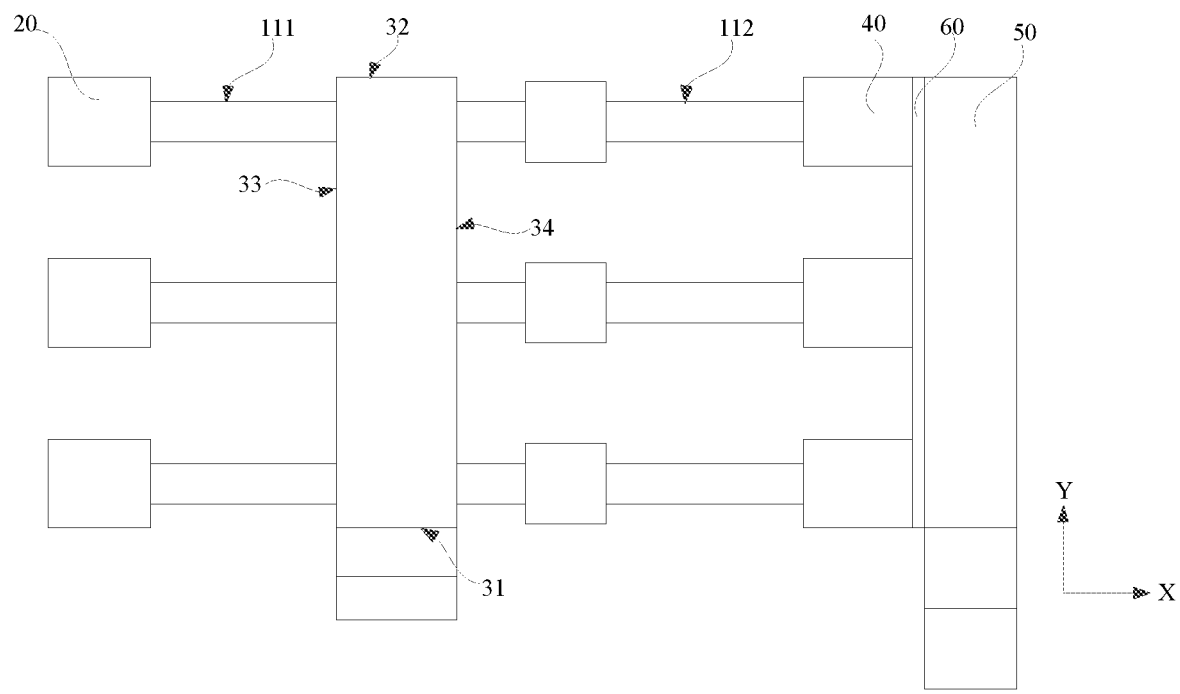
FIG. 8 is a vertical view of FIG. 7.

By taking the orientation shown in FIG. 7 as an example, the projection of the first second data line 30 on the substrate is partially overlapped with that of the second second data line 30 on the substrate. That is, it is proved that the first second data line 30 and the second second data line 30 are arranged in a staggered manner. In this way, in one aspect, connection between the remaining signal lines and the second data lines 30 may be facilitated to lower the difficulty of fabrication of the semiconductor structure; and in another aspect, a parasitic capacitance between the second data lines 30 at upper and lower layers may be reduced, thereby improving the performance of the semiconductor structure.

With continued reference to FIGS. 7 to 17, the plurality of third data lines 40 are spaced along the second direction, and each of the third data lines 40 extends along the first direction and connects all the second drains 1122 positioned in the same first direction.

The plurality of fourth data lines 50 are spaced along the first direction, each of the fourth data lines 50 extends along the second direction and connects all the second gates 1125 on the same layer. A projection of one of adjacent two fourth data lines 50 on the substrate is partially overlapped with a projection of other one of the adjacent two fourth data lines 50 on the substrate.

In this embodiment, adjacent fourth data lines 50 are arranged in a staggered manner. In this way, in one aspect, connection between the remaining signal lines and the fourth data lines 50 may be facilitated, to lower the difficulty of fabrication of the semiconductor structure. In another aspect, because a parasitic capacitance between the fourth data lines 50 at upper and lower layers may be reduced, turn-on sensitivity of the second transistor 112 can be improved, thereby improving the performance of the semiconductor structure.

A staggered arrangement of all the second data lines 30 and a staggered arrangement of all the fourth data lines 50 may be described with reference to following embodiments. It should be noted that the following embodiments are only several feasible exemplary embodiments, and are not intended to limit the structure or shape of the second data lines 30 or the fourth data lines 50.

Along the second direction, each of the second data lines 30 has a first surface 31 and a second surface 32 arranged oppositely. Taking the orientations shown in FIG. 7 and FIG. 8 as an example, the first surface 31 may be understood as a front surface of the second data line 30, and the second surface 32 may be understood as a rear surface of the second data line 30.

The first surfaces 31 or second surfaces 32 of all of the second data lines 30 are aligned, and the second surfaces 32 or first surfaces 31 of all of the second data lines 30 sequentially form steps from top to bottom along the first direction. In an example, the first surfaces 31 of all the second data lines 30 are aligned, none of the second surfaces 32 of all the second data lines 30 is aligned, and lengths of the second data lines 30 increase sequentially from top to bottom, such that the second surfaces 32 of all the second data lines 30 form steps. In another example, none of the first surfaces 31 of all of the second data lines 30 are aligned, and the second surfaces 32 of all of the second data lines 30 are aligned, such that the first surfaces 31 of all of the second data lines 30 form steps. It is convenient for fabrication of the remaining data lines, spacing between these data lines is also increased, thereby preventing occurrence of interference of transmission signals. In addition, the parasitic capacitance between the second data lines 30 at upper and lower layers may be reduced, thereby improving the performance of the semiconductor structure.

Figure 9:
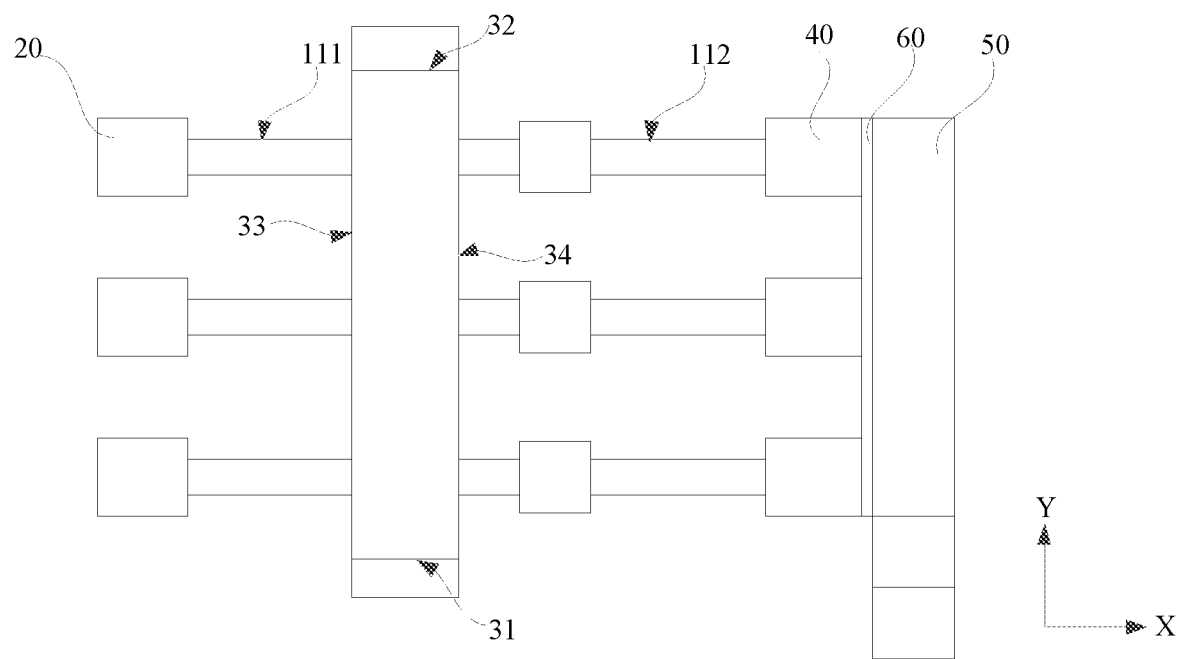
FIG. 9 is a schematic diagram II of the semiconductor structure provided by an embodiment of the present disclosure.

In another example, as shown in FIG. 9, all the second data lines 30 have a same length; neither the first surfaces 31 nor the second surfaces 32 of any adjacent two second data lines 30 are aligned. That is, the second surface 32 of the second second data line 30 is positioned behind the second surface 32 of a first second data lines 30, and the first surface 31 of a third second data lines 30 is positioned in front of the first surface 31 of the first second data lines 30. In this way, it may be ensured that every two of the three second data lines 30 are arranged in a staggered manner.

Figure 10:
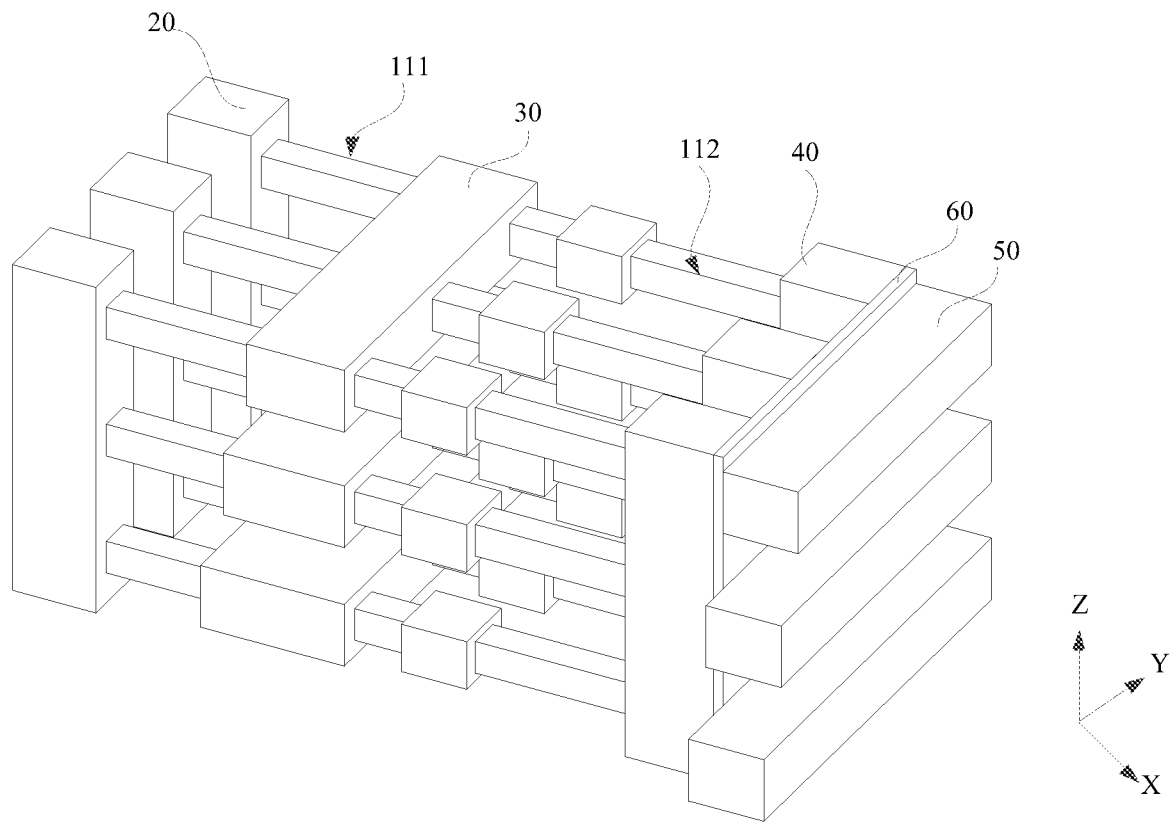
FIG. 10 is a schematic diagram III of the semiconductor structure provided by an embodiment of the present disclosure.
Figure 11:
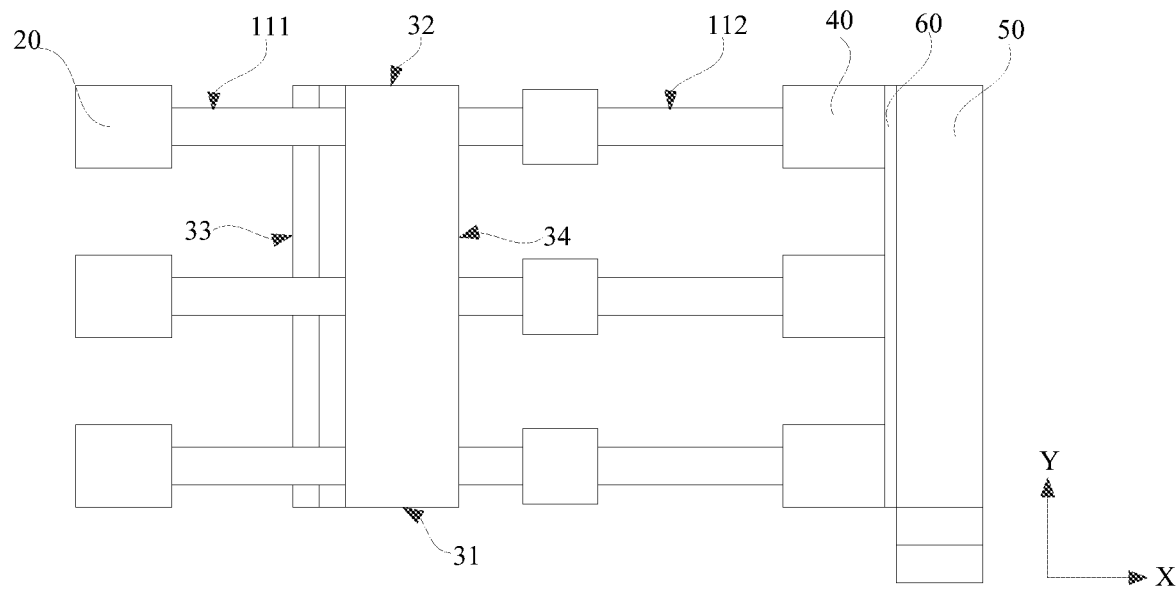
FIG. 11 is a vertical view of FIG. 10.
Figure 12:
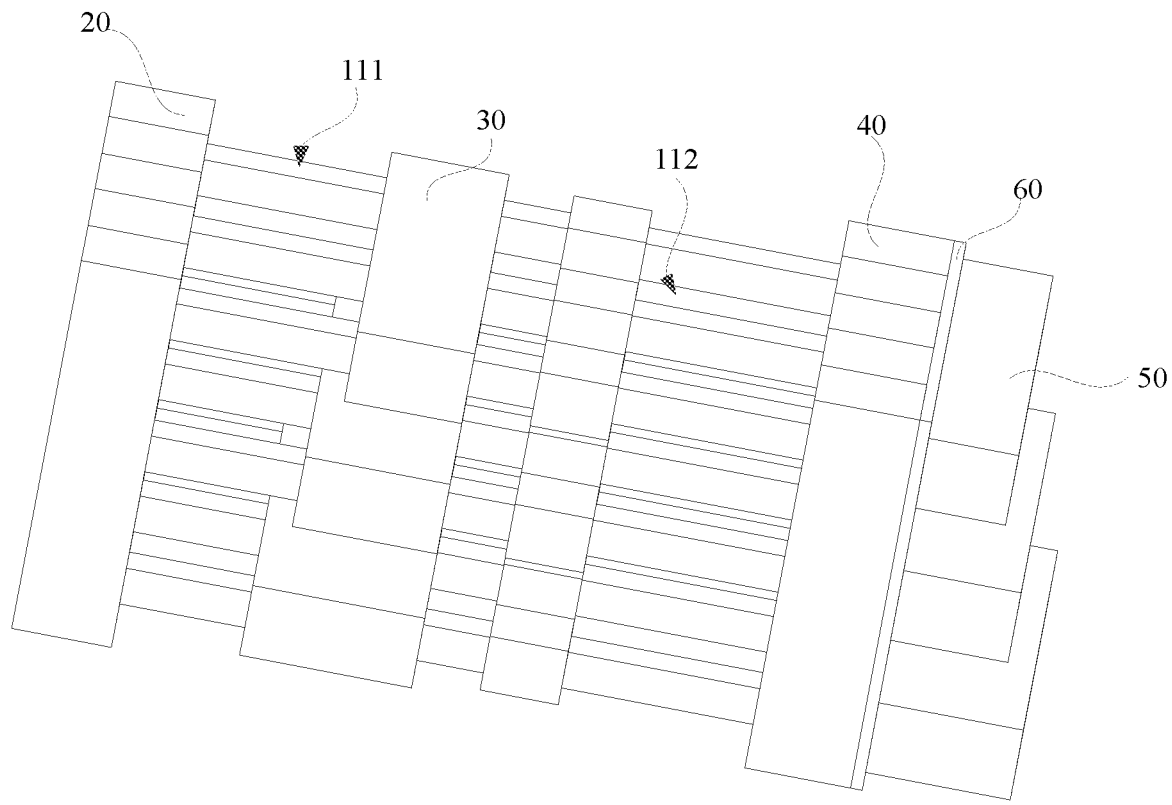
FIG. 12 is a schematic diagram IV of the semiconductor structure provided by an embodiment of the present disclosure.
Figure 13:
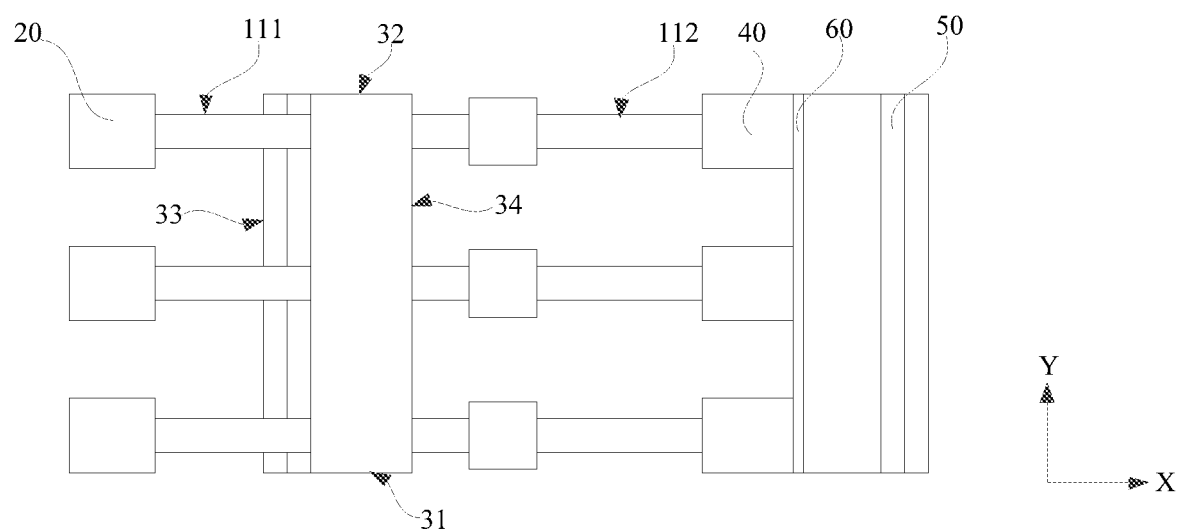
FIG. 13 is a vertical view of FIG. 12.
Figure 14:
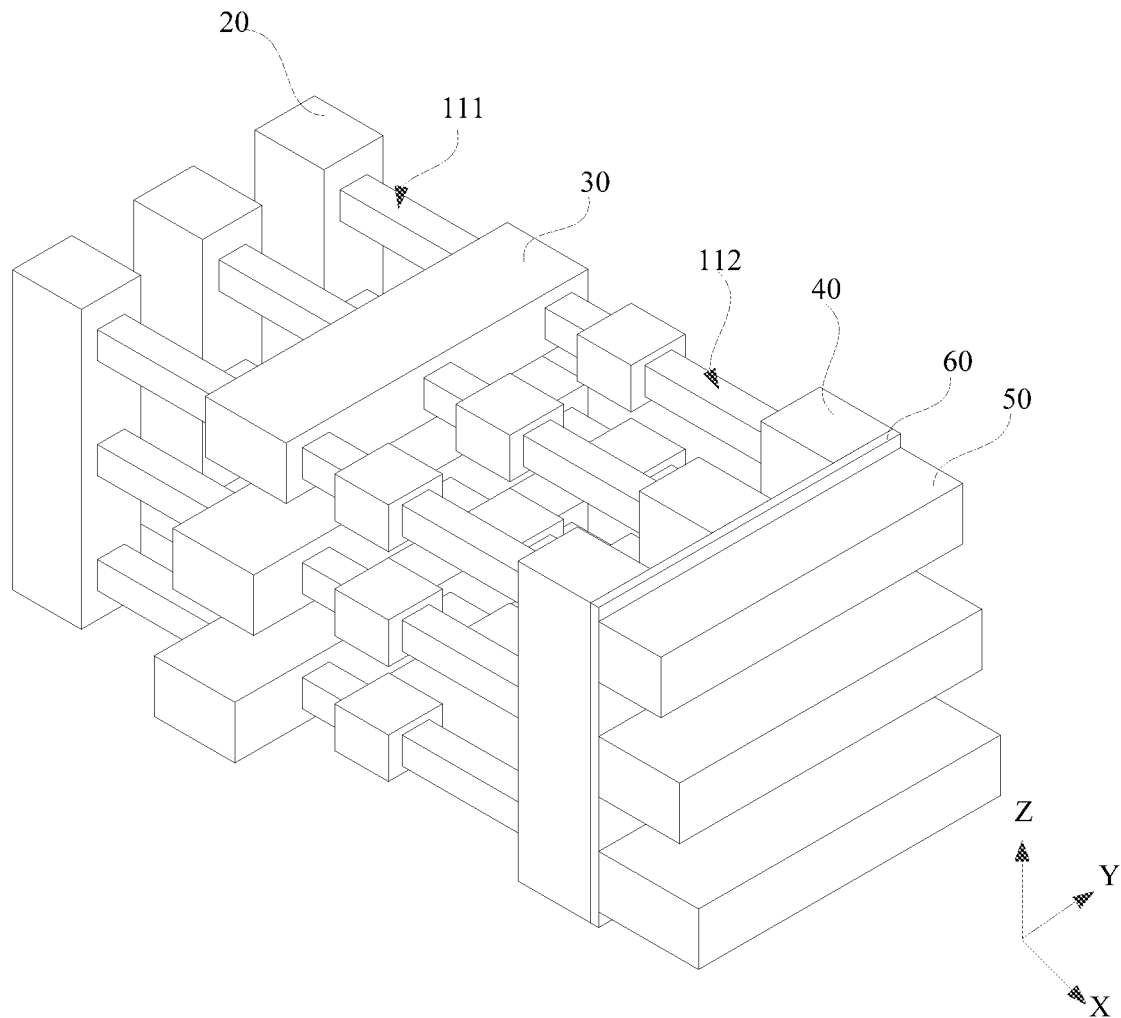
FIG. 14 is a schematic diagram V of the semiconductor structure provided by an embodiment of the present disclosure.
Figure 15:
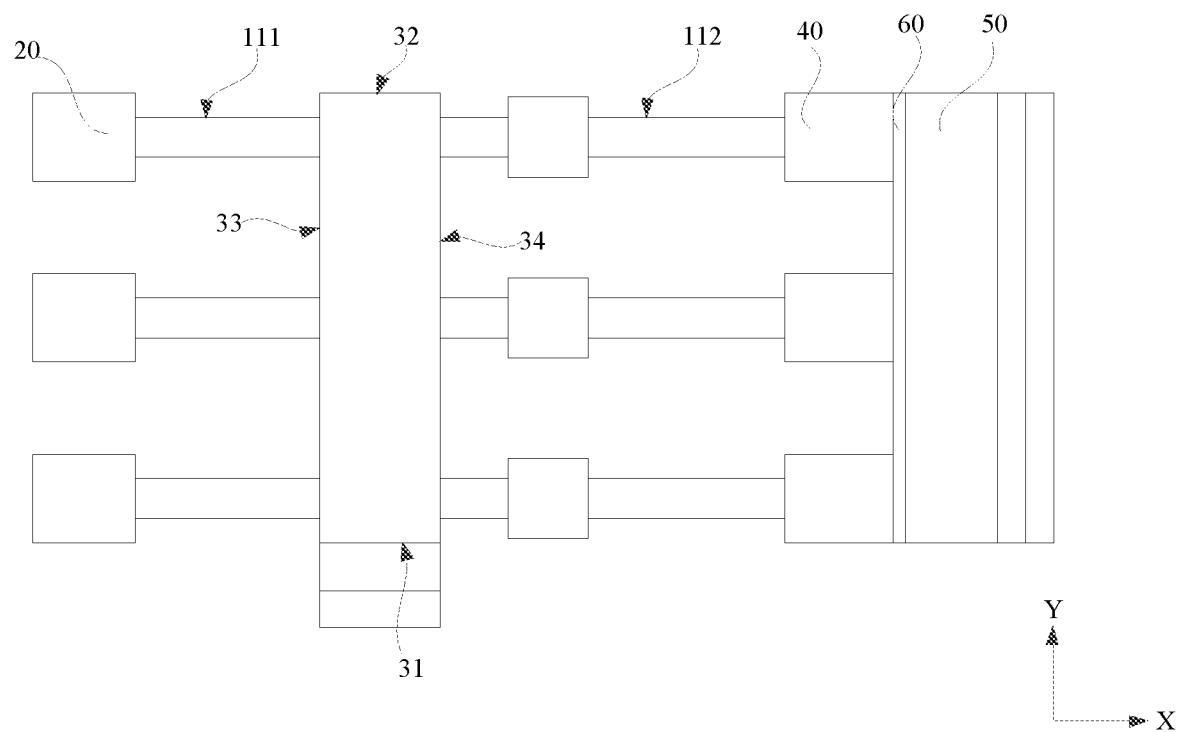
FIG. 15 is a vertical view of FIG. 14.

In yet another example, as shown in FIG. 10 and FIG. 11, along the third direction, each of the second data lines 30 has a third surface 33 and a fourth surface 34 arranged oppositely. Taking orientations as shown in FIG. 10 and FIG. 11 as an example, the third surface 33 is a left surface of the second data line 30, and the fourth surface 34 is a right surface of the second data line 30.

The third surfaces 33 or fourth surfaces 34 of all the second data lines 30 are aligned, and the fourth surfaces 34 or third surfaces 33 of all the second data lines 30 sequentially form steps from top to bottom along the first direction. That is, when all the third surfaces 33 are aligned, all the fourth surfaces 34 form the steps.

The fourth data lines 50 are configured to connect the second gates 1125 of all the second transistors 112 in the same layer, to facilitate connection between other data lines and the fourth data line 50, a structure of the fourth data line 50 may be the same as that of the second data line 30, and reference may be made to the structure of the second data line 30 for the structure of the fourth data line 50, which is not repeated here in this embodiment.

Figure 16:
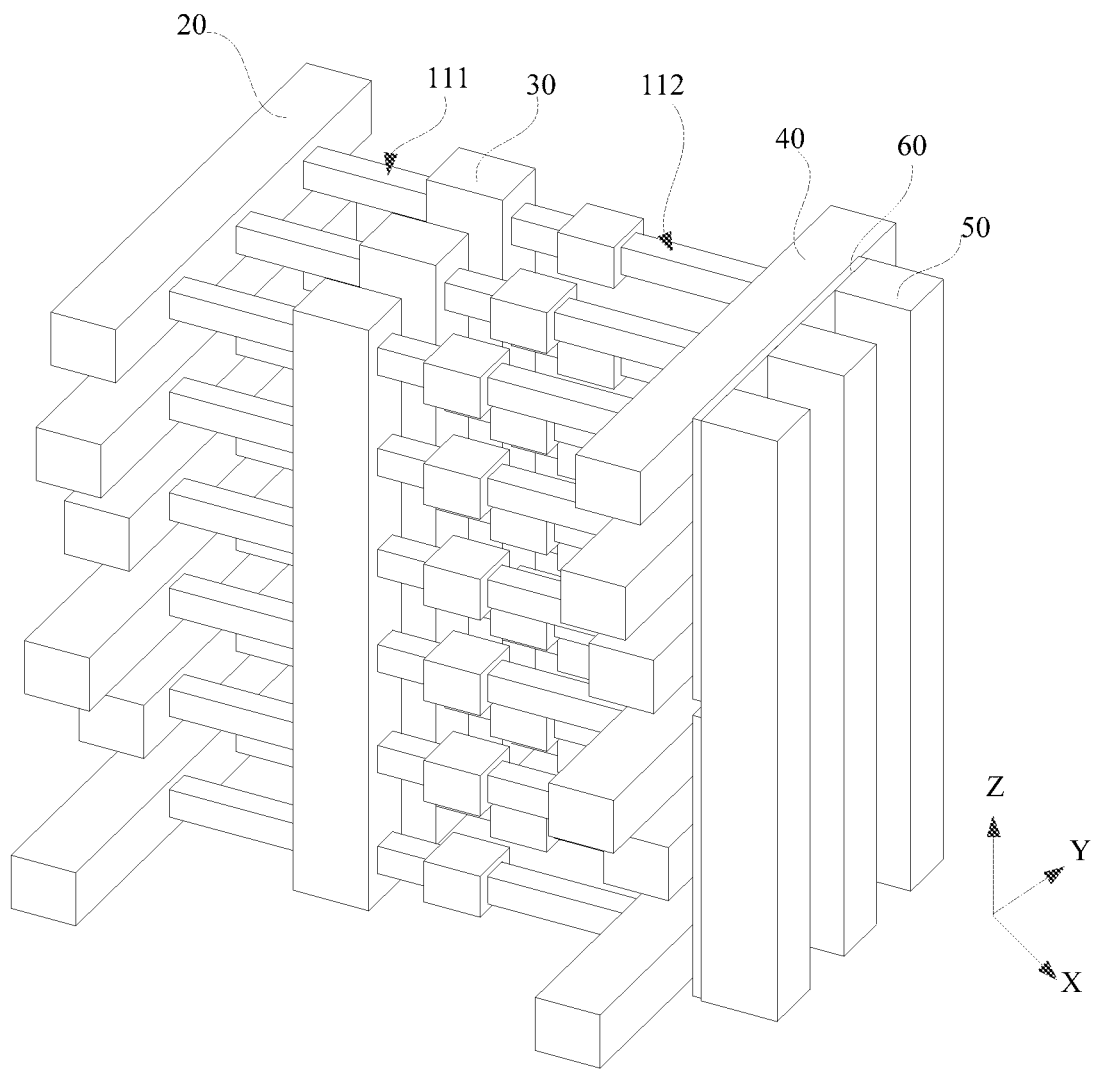
FIG. 16 is a schematic diagram VI of the semiconductor structure provided by an embodiment of the present disclosure.
Figure 17:
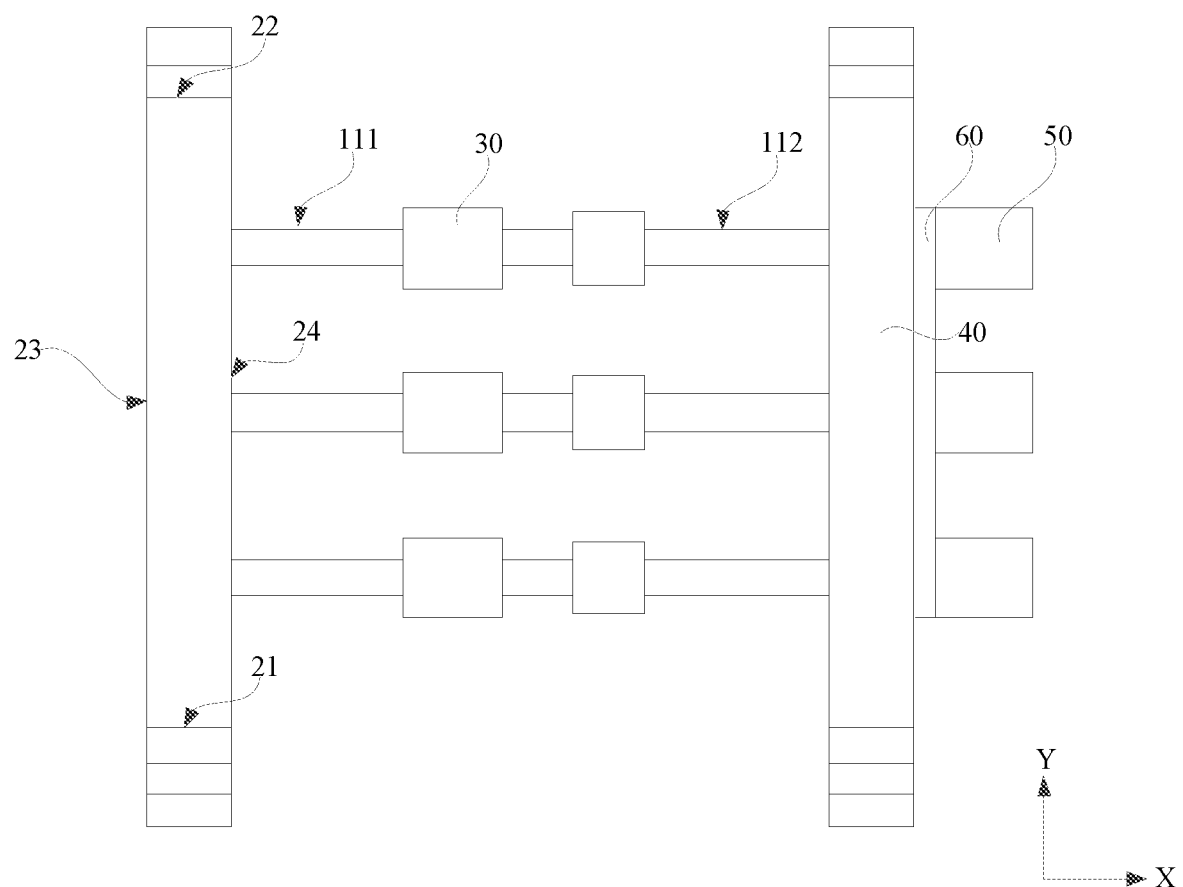
FIG. 17 is a vertical view of FIG. 16.

In some embodiments, as shown in FIG. 16 and FIG. 17, each of the first data lines 20 extends along the second direction and connects all the first sources 1111 on the same layer. A projection of one of adjacent two first data lines 20 on the substrate is partially overlapped with a projection of other one of the adjacent two first data lines 20 on the substrate. Each of the second data lines 30 extends along the first direction and connects the first drains 1112 positioned in the same first direction.

In this embodiment, any adjacent two first data lines 20 are arranged in a staggered manner. In this way, in one aspect, connection between the remaining signal lines and the first data lines 20 may be facilitated to lower the difficulty of fabrication of the semiconductor structure. In another aspect, a parasitic capacitance between the first data lines 20 at upper and lower layers may be reduced, thereby improving the performance of the semiconductor structure.

In addition, each of the third data lines 40 extends along the second direction and connects all of the second drains 1122 positioned on the same layer. A projection of one of adjacent two third data lines 40 on the substrate is partially overlapped with a projection of other one of the adjacent two third data lines 40 on the substrate. Each of the fourth data line 50 extends along the first direction and connects all the second gates 1125 positioned in the same first direction.

In this embodiment, any adjacent two third data lines 40 are arranged in a staggered manner. In this way, in one aspect, connection between the remaining signal lines and the third data lines 40 may be facilitated to lower the difficulty of fabrication of the semiconductor structure. In another aspect, a parasitic capacitance between the third data lines 40 at upper and lower layers may be reduced, thereby improving the performance of the semiconductor structure.

A staggered arrangement of all the first data lines 20 and a staggered arrangement of all the third data lines 40 may be described with reference to following embodiments. It should be noted that the following embodiments are only several feasible exemplary embodiments, and are not intended to limit the structures or shapes of the first data lines 20 or the third data lines 40.

Along the second direction, each of the first data lines 20 has a fifth surface 21 and a sixth surface 22 arranged oppositely; and along the third direction, each of the first data lines 20 has a seventh surface 23 and an eighth surface 24 arranged oppositely. Taking the orientation shown in FIG. 16 and FIG. 17 as an example, the fifth surface 21 is a front surface of the first data line 20, the sixth surface 22 is a rear surface of the first data line 20, the seventh surface 23 is a left surface of the first data line 20, and the eighth surface 24 is a right surface of the first data line 20.

In an example, the fifth surfaces 21 or sixth surfaces 22 of all of the first data lines 20 are aligned, the sixth surfaces 22 or fifth surfaces 21 of all of the first data lines 20 sequentially form steps from top to bottom along the first direction; or, all of the second data lines 30 have a same length; and neither the fifth surfaces 21 nor the sixth surfaces 22 of any adjacent two first data lines 20 are aligned.

In yet another example, the seventh surfaces 23 or eighth surfaces 24 of all of the first data lines 20 are aligned, the eighth surfaces 24 or seventh surfaces 23 of all of the first data lines 20 sequentially form steps from top to bottom along the first direction.

It should be noted that layout of the first data lines 20 in this embodiment is similar to that of the second data lines 30 arranged in a step shape in the above embodiment, and thus is not repeated here in this embodiment.

In this embodiment, the third data lines 40 are configured to connect the second drains 1122 of all the second transistors 112 in the same layer, to facilitate connection between other data lines and the third data lines 40, a structure of the third data line 40 may be the same as that of the first data line 20, and reference may be made to the structure of the first data line 20 for the structure of the third data line 40, which is not repeated here in this embodiment.

Figure 6:
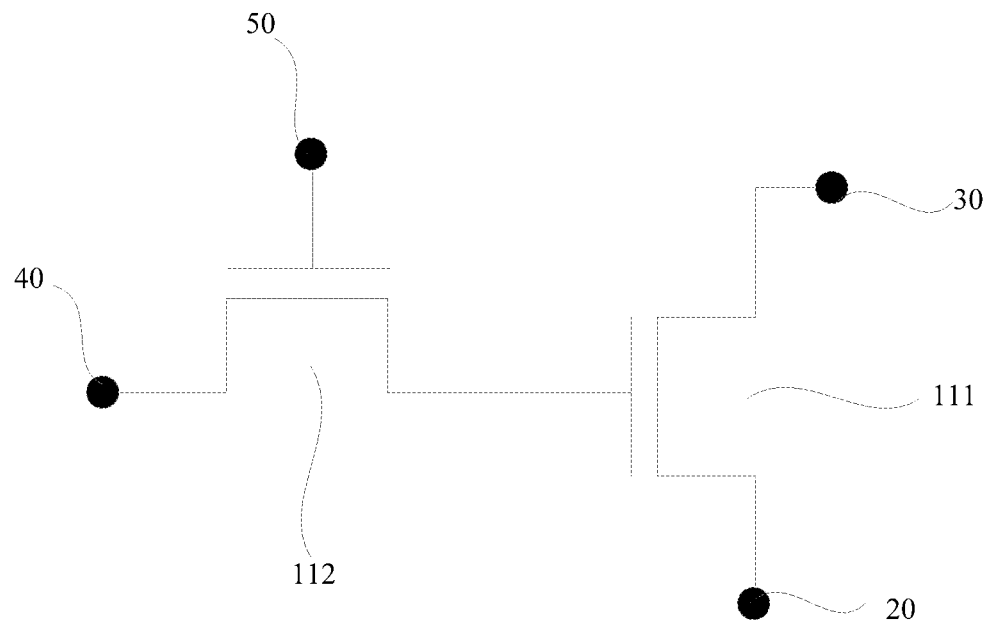
FIG. 6 is a circuit diagram of a memory cell and each data line provided by an embodiment of the present disclosure.

In some embodiments, with continued reference to FIG. 4 and FIG. 6, the first data line 20 is a read bit line, the second data line 30 is a read word line, the third data line 40 is a write bit line, and the fourth data line 50 is a write word line.

When a level signal of the fourth data line 50 is a high level signal, the high level signal may control the gate of the second transistor 112 to be turned on, and a voltage difference is generated between the second source 1121 and the second drain 1122 of the second transistor 112, such that the second source 1121 and the second drain 1122 of the second transistor 112 are conducted, a voltage of the third data line 40 may act on the gate of the first transistor 111, and data of the third data line 40 is written into the first transistor 111 to realize data writing.

When the data in the first transistor 111 needs to be read, the gate of the first transistor 111 may be turned on, such that the first source 1111 and the first drain 1112 of the first transistor 111 are conducted, the data in the transistor 111 may be transmitted to a peripheral circuit via the second data line 30, and the peripheral circuit may process the data to implement a read function of a memory.

In some embodiments, an insulating layer 60 is arranged between the third data line 40 and the fourth data line 50, such that an electrical connection between the third data line 40 and the fourth data line 50 may be prevented to increase a yield of the semiconductor structure. A material of the insulating layer 60 may include silicon nitride, but is not limited thereto.

The embodiments or the implementation manners in this specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiment or example are included in at least one embodiment or example of the present disclosure.

The schematic representation of the above terms throughout this specification does not necessarily refer to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A semiconductor structure, comprising:
a substrate;
a dielectric layer arranged on the substrate; and
a plurality of memory cell layers, the plurality of memory cell layers being spaced in the dielectric layer along a first direction, projections of any two adjacent of the plurality of memory cell layers on the substrate being overlapped, each of the plurality of memory cell layers comprising a plurality of memory cells spaced along a second direction, each of the plurality of memory cells comprising a first transistor and a second transistor connected to the first transistor, a first source, a first channel and a first drain of the first transistor being arranged along a third direction, the third direction and the substrate being parallel to each other, the first direction, the second direction and the third direction being perpendicular to one another, and the second direction and the third direction being positioned in a same horizontal plane;

wherein the first transistor is a columnar transistor, the first transistor further comprising a first gate and a first gate oxide layer, the first gate oxide layer and the first channel sequentially surrounding a portion of the first gate, and the first source and the first drain being spaced on the first channel;

wherein the second transistor is a columnar transistor, the second transistor comprising a second gate, a second channel, a second source, a second drain and a second gate oxide layer; the second source being electrically connected to an exposed portion of the first gate; and the second gate oxide layer and the second channel sequentially surround a portion of the second gate, the second source and the second drain being spaced on the second channel.

2. The semiconductor structure according to claim 1, wherein along the third direction, the first source and the first drain respectively wrap two opposite ends of the first channel.

3. The semiconductor structure according to claim 1, wherein the second source and the second drain respectively wrap two opposite ends of the second channel.

4. The semiconductor structure according to claim 3, wherein the first channel and the second channel are made of a same material, the material comprising any one of indium gallium zinc oxide, silicon, and silicon germanium.

5. The semiconductor structure according to claim 1, wherein the semiconductor structure further comprises a first data line, a second data line, a third data line, and a fourth data line;
one of the first data line and the second data line is configured to connect the first sources or first drains of all of the first transistors positioned in the same first direction, and other one of the first data line and the second data line is configured to connect the first drains or first sources of all of the first transistors positioned on a same layer; and
one of the third data line and the fourth data line is configured to connect the second drains or second gates of the second transistors positioned in the same first direction, and other one of the third data line and the fourth data line is configured to connect the second gates or second drains of all of the second transistors positioned on the same layer.

6. The semiconductor structure according to claim 5, wherein there are a plurality of the first data lines, a plurality of the second data lines, a plurality of the third data lines, and a plurality of the fourth data lines;
the plurality of first data lines are spaced along the second direction, each of the plurality of first data lines extending along the first direction and connecting all of the first sources positioned in the same first direction;
the plurality of second data lines are spaced along the first direction, each of the plurality of second data lines extending along the second direction and connecting all of the first drains on the same layer, and a projection of one of adjacent two of the plurality of second data lines on the substrate being partially overlapped with a projection of other one of adjacent two of the plurality of second data lines on the substrate;
the plurality of third data lines are spaced along the second direction, each of the plurality of third data lines extending along the first direction and connecting all of the second drains positioned in the same first direction; and
the plurality of fourth data lines are spaced along the first direction, each of the plurality of fourth data lines extending along the second direction and connecting all of the second gates on the same layer, and a projection of one of adjacent two of the plurality of fourth data lines on the substrate being partially overlapped with a projection of other one of adjacent two of the plurality of fourth data lines on the substrate.

7. The semiconductor structure according to claim 6, wherein along the second direction, each of the plurality of second data lines has a first surface and a second surface arranged oppositely; and
the first surfaces or second surfaces of all of the plurality of second data lines are aligned, the second surfaces or first surfaces of all of the plurality of second data lines sequentially forming steps from top to bottom along the first direction; or, all of the plurality of second data lines have a same length, and neither the first surfaces nor the second surfaces of any adjacent two of the plurality of second data lines are aligned.

8. The semiconductor structure according to claim 6, wherein along the third direction, each of the plurality of second data lines has a third surface and a fourth surface arranged oppositely; and
the third surfaces or fourth surfaces of all of the plurality of second data lines are aligned, the fourth surfaces or third surfaces of all of the plurality of second data lines sequentially forming steps from top to bottom along the first direction.

9. The semiconductor structure according to claim 7, wherein the plurality of fourth data lines have a same structure as the plurality of second data lines.

10. The semiconductor structure according to claim 5, wherein each of the plurality of first data lines extends along the second direction and connects all of the first sources positioned on the same layer, a projection of one of adjacent two of the plurality of first data lines on the substrate being partially overlapped with a projection of other one of adjacent two of the plurality of first data lines on the substrate;
each of the plurality of second data lines extends along the first direction and connects the first drains positioned in the same first direction;
each of the plurality of third data lines extends along the second direction and connects all of the second drains positioned on the same layer, a projection of one of adjacent two of the plurality of third data lines on the substrate being partially overlapped with a projection of other one of adjacent two of the plurality of third data lines on the substrate; and
each of the plurality of fourth data lines extends along the first direction and connects the second gates positioned in the same first direction.

11. The semiconductor structure according to claim 10, wherein along the second direction, each of the plurality of first data lines has a fifth surface and a sixth surface arranged oppositely; and
the fifth surfaces or sixth surfaces of all of the plurality of first data lines are aligned, the sixth surfaces or fifth surfaces of all of the plurality of first data lines sequentially forming steps from top to bottom along the first direction; or, all of the plurality of first data lines have a same length; and neither the fifth surfaces nor the sixth surfaces of any adjacent two of the plurality of first data lines are aligned.

12. The semiconductor structure according to claim 11, wherein along the third direction, each of the plurality of first data lines has a seventh surface and an eighth surface arranged oppositely; and the seventh surfaces or eighth surfaces of all of the plurality of first data lines are aligned, the eighth surfaces or seventh surfaces of all of the plurality of first data lines sequentially forming steps from top to bottom along the first direction.

13. The semiconductor structure according to claim 11, wherein the plurality of third data lines have the same structure as the plurality of first data lines.

14. The semiconductor structure according to claim 5, wherein the first data line is a read bit line, the second data line is a read word line, the third data line is a write bit line, and the fourth data line is a write word line.

15. The semiconductor structure according to claim 14, wherein an insulating layer is arranged between the third data line and the fourth data line.

\* \* \* \* \*